(12) United States Patent
Konishi et al.

(10) Patent No.: US 9,837,301 B2
(45) Date of Patent: Dec. 5, 2017

(54) METHOD FOR PRODUCING HYBRID SUBSTRATES, AND HYBRID SUBSTRATE

(71) Applicant: SHIN-ETSU CHEMICAL CO., LTD., Tokyo (JP)

(72) Inventors: Shigeru Konishi, Annaka (JP); Yoshihiro Kubota, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 2 days.

(21) Appl. No.: 14/416,724

(22) PCT Filed: Jul. 18, 2013

(86) PCT No.: PCT/JP2013/069487
§ 371 (c)(1),
(2) Date: Jan. 23, 2015

(87) PCT Pub. No.: WO2014/017369
PCT Pub. Date: Jan. 30, 2014

(65) Prior Publication Data
US 2015/0200129 A1    Jul. 16, 2015

(30) Foreign Application Priority Data
Jul. 25, 2012  (JP) ................. 2012-164656

(51) Int. Cl.
*H01L 21/336* (2006.01)
*H01L 21/762* (2006.01)

(52) U.S. Cl.
CPC .............. *H01L 21/76254* (2013.01)

(58) Field of Classification Search
CPC ................................... H01L 21/336
See application file for complete search history.

(56) References Cited

U.S. PATENT DOCUMENTS 6,479,836 B1 * 11/2002 Suzuki ............... B82Y 20/00
257/103
2005/0042789 A1    2/2005 Fujikura et al.
(Continued)

FOREIGN PATENT DOCUMENTS

EP    1 667 218 A1    6/2006
EP    1 811 560 A1    7/2007
(Continued)

OTHER PUBLICATIONS

European Search Report dated Feb. 22, 2016, issued in counterpart European Patent Application No. 13823207.9. (6 pages).
(Continued)

*Primary Examiner* — Marvin Payen
(74) *Attorney, Agent, or Firm* — Westerman, Hattori, Daniels & Adrian, LLP

(57) ABSTRACT

A method for producing hybrid substrates which can be incorporated into a semiconductor production line involves: forming an ion-injection region (3) by injecting ions from the surface of a silicon substrate (1); adhering the ion-injection surface of the silicon substrate and the surface of a sapphire substrate (4) to one another directly or with an insulating film (2) interposed therebetween; and then obtaining a hybrid substrate (8) having a silicon thin-film (semiconductor layer; 6) on the sapphire substrate (4), by detaching the silicon substrate (1) in the ion-injection region (3). This method is characterized in that the adhering to the silicon substrate (1) occurs after the sapphire substrate (4) is heat-treated in advance in a reducing atmosphere.

8 Claims, 1 Drawing Sheet

(56) References Cited

U.S. PATENT DOCUMENTS

| | | |
|---|---|---|
| 2007/0032043 A1 | 2/2007 | Endo et al. |
| 2007/0173033 A1 | 7/2007 | Allibert et al. |
| 2011/0227068 A1 | 9/2011 | Akiyama |
| 2012/0119323 A1 | 5/2012 | Akiyama et al. |

FOREIGN PATENT DOCUMENTS

| | | |
|---|---|---|
| EP | 2 357 660 A1 | 8/2011 |
| JP | 2004-111848 A | 4/2004 |
| JP | 2005-19872 A | 1/2005 |
| JP | 2010-278337 A | 12/2010 |
| JP | 2011/077608 A1 | 6/2011 |
| WO | 2010/137587 A1 | 12/2010 |

OTHER PUBLICATIONS

Yoshii et al., "Improvement of SOS Device Performance by Solid-Phase Epitaxy", Japanese Journal of Applied Physics, 1982, pp. 175-179, vol. 21, Supplement 21-1.
International Search Report dated Oct. 22, 2013, issued in corresponding application No. PCT/JP2013/069487.

* cited by examiner

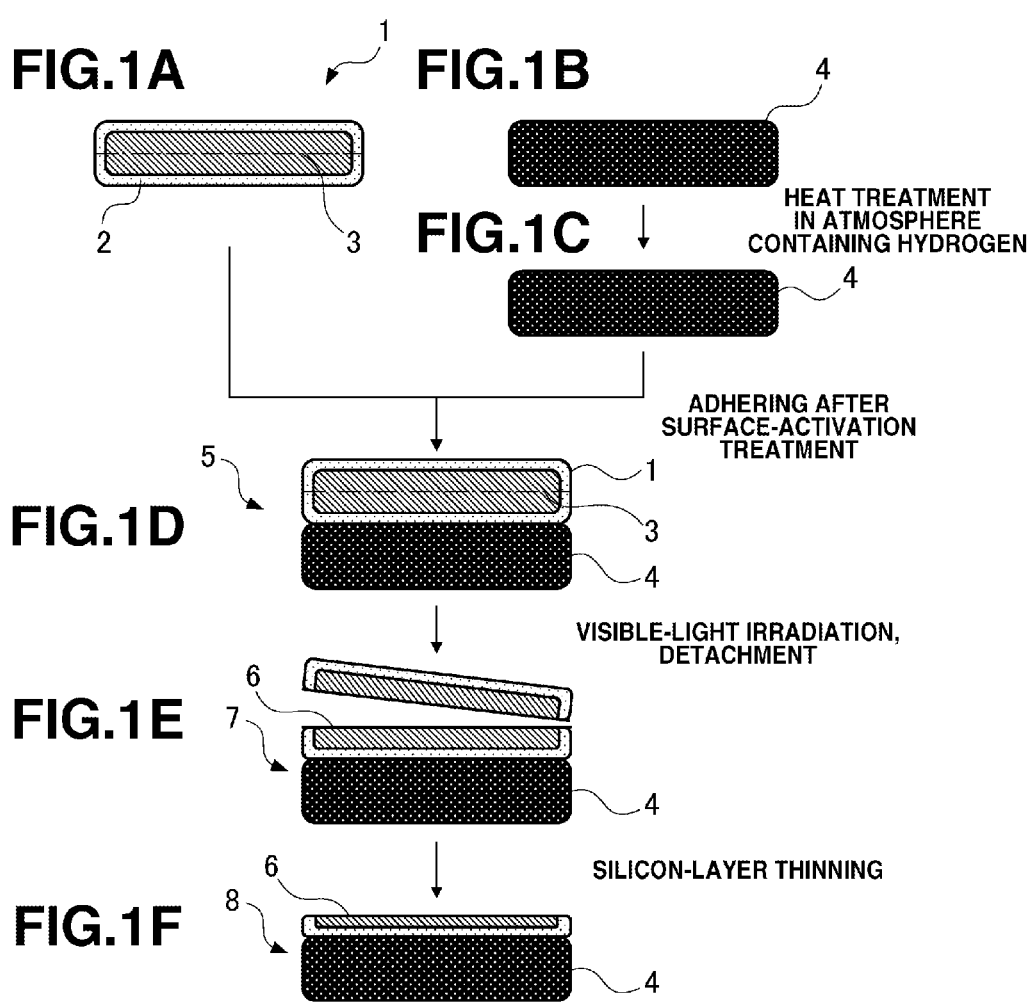

METHOD FOR PRODUCING HYBRID SUBSTRATES, AND HYBRID SUBSTRATE

TECHNICAL FIELD

This invention relates to a method for producing a hybrid substrate having a semiconductor layer on a support substrate, and a hybrid substrate produced by the method.

BACKGROUND ART

In the prior art, hybrid substrates, typically silicon-on-sapphire (SOS) substrates based on support substrates of sapphire having characteristics including good insulation, a high thermal conductivity, and a low loss in the radio-frequency band are used to construct devices for radio-frequency applications.

For the manufacture of SOS, heteroepitaxial growth of silicon on sapphire substrates is well known. This method has the drawback that many defects generate owing to the difference in lattice constant between sapphire and silicon (see Non-Patent Document 1, for example).

In view of the above problem, there was proposed a method comprising the steps of bonding a hydrogen ion-implanted silicon substrate to a sapphire substrate, making the hydrogen ion-implanted layer brittle, and separating the silicon substrate for thereby transferring a single crystal silicon thin film onto the sapphire substrate (see JP-A 2010-278337: Patent Document 1, for example).

CITATION LIST

Patent Documents

Patent Document 1: JP-A 2010-278337
Patent Document 2: JP-A 2004-111848

Non-Patent Document

Non-Patent Document 1: Yoshii et al., Japanese Journal of Applied Physics, Vol. 21, Supplement 21-1, pp. 175-179 (1982)

SUMMARY OF INVENTION

Technical Problem

However, the above-mentioned SOS technology using sapphire substrates as the support substrate suffers from the problem that the sapphire substrates themselves have a high metal concentration, especially high Fe concentration at their surface. Typical sapphire substrates have a Fe concentration of $1\times10^{11}$ to $1\times10^{12}$ atoms/cm$^2$, which is higher by one or two orders than the concentration of $1\times10^{10}$ atoms/cm$^2$ required in the semiconductor line using silicon wafers or the like. This raises the problem that since SOS having such a metal concentration causes contamination to the semiconductor manufacture line, it cannot be incorporated in the line. It is contemplated that the metal concentration may be reduced, for example, by cleaning with solution SC-2 ($HCl+H_2O_2+H_2O$) used in the cleaning of silicon wafers. Even after cleaning, however, the metal concentration of sapphire substrates is not so reduced, with a failure to reach the level of $1\times10^{10}$ atoms/cm$^2$.

Also, SOS fabricated by the bonding method has the problem that there are many defects originating from the bonding method, such as voids in silicon film and oxidation-induced stacking fault (OSF).

An object of the invention, which has been made under the above-mentioned circumstances, is to provide a method for producing a hybrid substrate which can be incorporated in the semiconductor manufacture line, and a hybrid substrate produced by the method.

Solution to Problem

Making intensive efforts to attain the above object, the inventors have found that by heat treating a sapphire substrate in a reducing atmosphere, preferably a hydrogen-containing atmosphere, metal impurities can be substantially removed from the sapphire surface. With regard to the preparation of SOS substrates by the bonding method, the inventors have also found that when the heat treated sapphire substrate is used, the number of defects on a silicon thin film, which has been transferred to the sapphire substrate, is dramatically reduced as compared with the use of untreated substrate.

Notably, with respect to the heat treatment of a sapphire substrate in a hydrogen-containing atmosphere, it is known to heat treat a sapphire substrate prior to the epitaxial growth of nitride semiconductor layer directly on the sapphire substrate, as described in Patent Document 2: JP-A 2004-111848, for example. However, it is not referred to that hydrogen heat treatment is effective for reducing the metal impurity concentration. The manufacture of SOS substrate using the heat treated sapphire substrate as the support substrate is described nowhere. Further, it is nowhere described or suggested that the heat treatment is effective for reducing the number of defects in a silicon layer formed on the support substrate.

Also, the technology of heat treatment after hybridization, that is, heat treating the bonded substrate in a hydrogen atmosphere is utilized in the planarization of silicon layer in the SOI (silicon-on-insulator) technology or the like. As long as the inventors investigated, the heat treatment of hybridized SOS in a hydrogen-containing atmosphere was not confirmed effective for reducing the number of defects in a silicon layer.

It is important that the heat treatment of a sapphire substrate in a hydrogen-containing atmosphere precede the bonding step. As long as the heat treatment precedes, it is successful in removing metal impurities from the sapphire substrate, and optionally in reducing the number of defects in a silicon thin film after bonding. These effects are first discovered by the inventors.

Accordingly, to attain the above object, the invention provides a method for producing a hybrid substrate and a hybrid substrate, as defined below.

[1] A method for producing a hybrid substrate comprising the steps of implanting ions into a surface of a semiconductor substrate to form an ion-implanted region, bonding the ion-implanted surface of the semiconductor substrate to a surface of a support substrate directly or via an insulating film, and separating the semiconductor substrate at the ion-implanted region, thus leaving a hybrid substrate having a semiconductor layer on the support substrate, characterized in that
the support substrate is heat treated in a reducing atmosphere prior to the step of bonding the support substrate to the semiconductor substrate.

[2] The method for producing a hybrid substrate of [1] wherein the support substrate is heat treated at a temperature of at least 900° C.

[3] The method for producing a hybrid substrate of [1] or [2] wherein the support substrate is heat treated at a temperature of up to 1,100° C.

[4] The method for producing a hybrid substrate of any one of [1] to [3] wherein the reducing atmosphere is hydrogen or an inert gas atmosphere containing hydrogen.

[5] The method for producing a hybrid substrate of any one of [1] to [4] wherein the semiconductor substrate comprises a material selected from the group consisting of silicon, silicon-germanium, silicon carbide, germanium, gallium nitride, zinc oxide, and gallium arsenide.

[6] The method for producing a hybrid substrate of any one of [1] to [5] wherein the support substrate comprises a material selected from the group consisting of silicon, silicon carbide, silicon nitride, sapphire, diamond, aluminum nitride, gallium nitride, zinc oxide, quartz, and borosilicate glass.

[7] A hybrid substrate obtained by the method of any one of [1] to [6].

Advantageous Effects of Invention

According to the invention, a support substrate is heat treated in a reducing atmosphere before it is bonded to a semiconductor substrate. Since metal impurities are removed from the support substrate, there is produced a hybrid substrate which is ready for use in the semiconductor manufacture line. Also the number of defects on the semiconductor layer surface can be reduced.

BRIEF DESCRIPTION OF DRAWINGS

FIGS. 1A to 1F are a schematic view showing steps of the method for producing a hybrid substrate according to one embodiment of the invention; FIG. 1A being a cross-sectional view of an ion-implanted silicon substrate; FIG. 1B being a cross-sectional view of a sapphire substrate; FIG. 1C being a cross-sectional view of the sapphire substrate which has been heat treated in a hydrogen atmosphere; FIG. 1D being a cross-sectional view of a bonded structure of silicon substrate/sapphire substrate; FIG. 1E being a cross-sectional view of the structure from which the silicon substrate is separated along the ion-implanted region; FIG. 1F being a cross-sectional view of a hybrid substrate.

DESCRIPTION OF EMBODIMENTS

The method for producing a hybrid substrate according to the invention is described with reference to FIGS. 1A to 1F illustrating the production of an SOS substrate as a typical example, although the invention is not limited thereto.

The method for producing a hybrid substrate according to the invention involves, as shown in FIGS. 1A to 1F, the following successive steps: step 1 of implanting hydrogen ions (rare gas ions) into a silicon substrate, step 2 of heat treating a sapphire substrate in a hydrogen atmosphere, step 3 of surface activating the silicon substrate and/or sapphire substrate, step 4 of bonding the silicon substrate to the sapphire substrate, step 5 of irradiating visible light and separating, and step 6 of thinning a silicon layer.

(Step 1 of Implanting Hydrogen Ions (Rare Gas Ions) into Silicon Substrate)

First, hydrogen ions or rare gas (i.e., helium, neon, argon, krypton, xenon or radon) ions are implanted into a single crystal silicon substrate (donor substrate) 1 from its surface to form a laminar ion-implanted region 3 (also referred to as ion-implanted layer) in the substrate (FIG. 1A).

Although the embodiment illustrated herein uses a silicon substrate as the substrate (semiconductor substrate) in which a semiconductor layer is to be formed by transfer, the invention is not limited thereto. A substrate composed of any material selected from the group consisting of silicon-germanium, silicon carbide, germanium, gallium nitride, zinc oxide, and gallium arsenide may be used as the semiconductor substrate.

The single crystal silicon substrate 1 (also referred to as silicon substrate, hereinafter) used as the semiconductor substrate may be, for example, a substrate obtained by slicing a single crystal ingot grown by the Czochralski (CZ) method and typically having a diameter of 100 to 300 mm, a conductivity type: P or N type, and a resistivity of about 10 Ω·cm, but not limited thereto.

Also preferably, a thin insulating film 2 is previously formed on the surface of silicon substrate 1. This is because when ions are implanted through the insulating film 2, an effect of suppressing channeling of implanting ions is obtainable. While examples of the insulating film 2 include a silicon oxide film, aluminum oxide film, silicon nitride film and the like, a silicon oxide film having a thickness of 50 to 500 nm is preferred. The silicon oxide film may be formed by the general heat oxidation method.

The method of forming the ion-implanted region 3 is not particularly limited. For example, a predetermined dose of hydrogen ions or rare gas ions are implanted with an implantation energy sufficient to form the ion-implanted region 3 at the desired depth from the surface of silicon substrate 1. Implantation conditions include, for example, an implantation energy of 50 to 100 keV and an implantation dose of $2\times10^{16}$ to $1\times10^{17}/cm^2$. Hydrogen ions to be implanted are preferably hydrogen ions ($H^+$) in a dose of $2\times10^{16}$ to $1\times10^{17}$ atoms/$cm^2$ or hydrogen molecule ions ($H_2^+$) in a dose of $1\times10^{16}$ to $5\times10^{16}$ atoms/$cm^2$. Most preferred are hydrogen ions ($H^+$) in a dose of $8.0\times10^{16}$ atoms/$cm^2$ or hydrogen molecule ions ($H_2^+$) in a dose of $4.0\times10^{16}$ atoms/$cm^2$.

While the depth from the substrate surface subject to ion implantation to the ion-implanted region 3 (that is, depth of ion implantation) corresponds to the desired thickness of a silicon thin film to be formed on the sapphire substrate serving as the support substrate, the depth of ion implantation is preferably 300 to 500 nm, more preferably about 400 nm. The thickness of ion-implanted region 3 (that is, ion distribution thickness) may be sufficient to facilitate separation or exfoliation by mechanical impacts or the like, and is preferably 200 to 400 nm, more preferably about 300 nm.

(Step 2 of Heat Treating Sapphire Substrate in Hydrogen Atmosphere)

Next, the sapphire substrate 4 is previously heat treated in a reducing atmosphere (FIGS. 1B and 1C).

Although the embodiment illustrated herein uses a sapphire substrate as the support substrate, the invention is not limited thereto. A substrate composed of any material selected from the group consisting of silicon, silicon carbide, silicon nitride, diamond, aluminum nitride, gallium nitride, zinc oxide, quartz, and borosilicate glass may be used as the support substrate.

Herein the sapphire substrate 4 is an insulating transparent substrate serving as the support substrate or handle substrate for the hybrid substrate, which desirably causes a less energy loss of light in the visible band (wavelength 400-700 nm) until reaching the ion-implanted region 3 in the silicon substrate 1 bonded thereto. A substrate having a transmittance of at least 70% in the visible band is preferred (FIG. 1B). For example, a sapphire substrate of crystal orientation R-face (1102) may be used.

Suitable reducing atmospheres include, for example, a reducing gas of a species selected from carbon monoxide, hydrogen sulfide, sulfur dioxide, hydrogen and formaldehyde, or a combination thereof, and an atmosphere composed of a mixture of the reducing gas with an inert gas. Of these, an atmosphere containing at least hydrogen, that is, an atmosphere of hydrogen alone or hydrogen-containing inert gas is preferred, and an atmosphere of hydrogen alone is more preferred.

The lower limit of the heat treatment temperature is preferably at least 700° C., more preferably at least 900° C., and most preferably at least 1,000° C. If the heat treatment temperature is below 700° C., the effect of removing metal from the surface of sapphire substrate 4 may be insufficient.

The upper limit of the heat treatment temperature is preferably below 1,250° C., more preferably up to 1,100° C. If the heat treatment temperature is equal to or above 1,250° C., the number of defects on the surface of silicon thin film in the hybrid substrate may be rather increased, which is inadequate for the hybrid substrate.

The heat treatment time is preferably 10 seconds to 12 hours, more preferably 1 minute to 1 hour. If the heat treatment time is less than 10 seconds, the removal of metal from the surface of sapphire substrate 4 may be insufficient, or the number of defects on the surface of silicon thin film in the hybrid substrate may be insufficiently reduced. If the heat treatment time exceeds 12 hours, the cost of heat treatment may increase.

The furnace for heat treatment is not particularly limited as long as hydrogen can be introduced in the furnace to establish a reducing atmosphere. A tubular furnace, an epitaxial growth furnace, and a rapid thermal annealing (RTA) furnace may be used.

Once heat treatment is carried out as illustrated above, the metal concentration on the surface of sapphire substrate 4 is reduced from the initial (FIG. 1C). At this point, the surface roughness of sapphire substrate 4 remains substantially unchanged, which does not interfere with its bonding to the silicon substrate 1. When heat treatment is at a temperature of 700 to 1,100° C., the number of defects on the surface of silicon thin film in the hybrid substrate (to be described later) can be reduced than in the prior art. This is presumably because the heat treatment introduces microscopic shape changes on the surface of sapphire substrate 4, increases and/or makes uniform the adhesive force during bonding, and removes particles and other deposits, although the reason is not well understood.

(Step 3 of Surface Activation of Silicon Substrate and/or Sapphire Substrate)

After the heat treatment and before the bonding, one or both of the surface of silicon substrate 1 subject to ion implantation and the surface of heat treated sapphire substrate 4 are subjected to surface activation treatment.

The surface activation treatment intends to activate the substrate surface by exposing highly reactive dangling bonds on the substrate surface or by imparting OH groups to the dangling bonds. This may be achieved, for example, by plasma treatment or ion beam irradiation.

In the case of plasma treatment, for example, the silicon substrate 1 and/or sapphire substrate 4 is placed in a vacuum chamber, a plasma-creating gas is introduced therein, and the substrate is exposed to a high-frequency plasma of about 100 W for about 5 to 10 seconds, whereby the surface is plasma treated. For the treatment of silicon substrate 1, the plasma-creating gas may be a plasma of oxygen gas when the surface is oxidized, or hydrogen gas, argon gas, a mixture of hydrogen gas and argon gas, or a mixture of hydrogen gas and helium gas, when the surface is not oxidized. For the treatment of sapphire substrate 4, the plasma-creating gas may be hydrogen gas, argon gas, a mixture of hydrogen gas and argon gas, or a mixture of hydrogen gas and helium gas. Through the treatment, any organic matter on the surface of silicon substrate 1 and/or sapphire substrate 4 is oxidized and removed and more OH groups are available on the surface, that is, the surface is activated.

In the treatment by ion beam irradiation, ion beams of the gas used in the plasma treatment are irradiated to the silicon substrate 1 and/or sapphire substrate 4 for sputtering its surface, for thereby exposing dangling bonds on the surface to increase the bonding force.

(Step 4 of Bonding Silicon Substrate and Sapphire Substrate Together)

Next, the surface of silicon substrate 1 subject to ion implantation and the surface of heat treated sapphire substrate 4 are bonded together (FIG. 1D). The substrates may be bonded together while heating at about 150 to 200° C. The joined assembly is referred to as bonded substrate 5, hereinafter. If at least one of the surface of silicon substrate 1 subject to ion implantation and the surface of sapphire substrate 4 has been activated, a tighter bond is established. Understandably, the insulating film (silicon oxide film) 2 on silicon substrate 1 may be thinned or removed by etching or grinding before the silicon substrate 1 is bonded to the sapphire substrate 4.

After the bonding step, the bonded substrate 5 is heat treated (second heat treatment) by applying heat. The second heat treatment reinforces the bond between silicon substrate 1 and sapphire substrate 4. For the second heat treatment, a temperature at which the bonded substrate 5 is not ruptured by the impact (i.e., thermal stress) of the difference in coefficient of thermal expansion between silicon substrate 1 and sapphire substrate 4 is selected. The heat treatment temperature is preferably up to 300° C., more preferably 150 to 250° C., and even more preferably 150 to 200° C. The heat treatment time is typically 1 to 24 hours.

(Step 5 of Irradiating Visible Light and Separating)

Next, visible light is irradiated toward the ion implanted region 3 of silicon substrate 1 in bonded substrate 5 for annealing. At this point, light may be irradiated from the side of transparent sapphire substrate 4. The visible light is light having the maximum wavelength in the range of 400 to 700 nm, and may be either coherent or incoherent. Preference is given to laser light in a wavelength region of 400 to 700 nm, more preferably 500 to 600 nm.

Where laser light is irradiated as the visible light, it reaches the silicon substrate 1 without heating the sapphire substrate 4 because it is transmitted by the sapphire substrate 4 and little absorbed thereby. The laser light incident on the silicon substrate 1 selectively heats only an area close to the bonding interface of silicon substrate 1 with sapphire substrate 4, specifically the ion-implanted region 3 which has been made amorphous by hydrogen ion implantation, for example, and thus promotes embrittlement of the ion-implanted region 3.

After the visible light irradiation, an impact, typically mechanical impact is applied to the embrittled ion-implanted region 3 in the bonded substrate 5 from the outside to induce separation along the ion-implanted region 3 for thereby transferring a portion of the silicon substrate 1 to the sapphire substrate 4 as a silicon thin film 6 (including a silicon oxide film if it is used and not removed) which serves as a semiconductor layer, thus yielding a wafer 7. That is, the silicon thin film 6 bonded to sapphire substrate 4 is separated from the silicon substrate 1 and used as a SOI layer (semiconductor layer). The separation is preferably by the progress of cleavage along the ion-implanted region 3 from one end to the opposite end of bonded substrate 5.

In this step, a variety of techniques may be used for applying an impact from the outside for separation of silicon thin film. Examples include a technique of applying thermal impact for separation, a technique of applying mechanical impact for separation, and a technique of applying vibratory impact for separation. It is necessary that the technique does not cause separation at the interface between silicon thin film 6 and sapphire substrate 4 and the processing temperature is not excessively high for the hybrid substrate.

Specifically, the technique of applying thermal impact for separation may be by heating either one surface of the bonded substrate 5, for example, the surface on the silicon substrate 1 side, to introduce a temperature difference between silicon substrate 1 and sapphire substrate 4. A substantial stress is created between the substrates via rapid expansion on the silicon substrate 1 side. The stress causes separation along the ion-implanted region 3.

Also, the technique of applying mechanical impact for separation may be by injecting a jet of fluid such as gas or liquid to the side surface of silicon substrate 1 to apply impact, or by forcing the tip of a blade against a region near the ion-implanted region 3 to apply impact.

During the separation treatment, a reinforcement is preferably attached to the silicon substrate 1 side of bonded substrate 5 when mechanical impact is applied. The reinforcement is preferably selected from the group consisting of a protective tape, electrostatic chuck, and vacuum chuck. A technique of attaching a protective tape to the silicon substrate 1 side for fissure prevention prior to separation or a technique of tightly holding the silicon substrate 1 side with an electrostatic chuck or vacuum chuck prior to separation ensures effective separation. The protective tape is not limited to a particular material and thickness, and may be any of dicing tape, BG tape and the like used in the semiconductor manufacture process. The electrostatic chuck is not particularly limited, with electrostatic chucks of ceramics such as silicon carbide and aluminum nitride being exemplary. The vacuum chuck is not particularly limited, with vacuum chucks of porous polyethylene and alumina being exemplary.

Further the technique of applying vibratory impact for separation may be by emitting ultrasonic wave from an oscillator of a ultrasonic vibrator to apply vibratory impact for causing separation along the ion-implanted region 3.

(Step 6 of Thinning Silicon Layer (and Removing Ion-Implantation-Affected Layer))

Next, a layer which contains crystal defects as a result of being damaged by ion implantation is removed from the surface of silicon thin film 6 on sapphire substrate 4 of wafer 7.

Herein, the removal of the ion-implantation-affected layer is preferably carried out by wet etching or dry etching. The wet etching may be carried out using at least one etching solution selected from, for example, KOH solution, $NH_4OH$ solution, NaOH solution, CsOH solution, SC-1 solution consisting of aqueous ammonia (28 wt %), aqueous hydrogen peroxide (30-35 wt %), and the balance of water, EDP (ethylenediamine pyrocatechol) solution, TMAH (tetramethylammonium hydroxide) solution, and hydrazine solution. Examples of dry etching include reactive gas etching of exposing the silicon thin film 6 on sapphire substrate 4 to fluorine-based gas, and reactive ion etching of creating a plasma of fluorine-based gas for ionization and etching the silicon thin film 6 with the resulting radicals.

Also, the region to be removed in this step is the entire ion-implantation-affected layer of the silicon thin film 6 which contains at least crystal defects, that is, a surface layer of the silicon thin film 6 having a thickness of preferably at least 120 nm, more preferably at least 150 nm. The silicon thin film 6 on sapphire substrate 4 has a thickness of 100 to 400 nm.

Finally, the silicon thin film 6 on sapphire substrate 4 is mirror finished at its surface. Specifically, the silicon thin film 6 is subjected to chemical-mechanical polishing (CMP) to mirror finish. Polishing may be any prior art well-known CMP used for the planarization of silicon wafers. Notably, the CMP may additionally achieve the removal of the ion-implantation-affected layer.

Past the aforementioned steps, there is obtained a hybrid substrate 8 which is ready for use in the semiconductor manufacture line because metal impurities have been removed from the sapphire substrate 4 (support substrate). The number of defects on the surface of silicon thin film 6 is reduced.

EXAMPLES

Examples and Comparative Examples are given below for illustrating the invention, but the invention is not limited thereto.

Example 1

A hybrid substrate was fabricated according to the production procedure shown in FIGS. 1A to 1F. It is noted that the bonding of silicon substrate 1 to heat treated sapphire substrate 4 and the transfer of silicon thin film 6 (formation of silicon thin film) are in accord with the method of JP-A 2010-278337 (Patent Document 1). Specifically, the procedure is as follows.

(Step 1) Into a silicon substrate 1 with an outer diameter 150 mm and a thickness 625 μm on which a silicon oxide film had been grown to a thickness of 200 nm as an insulating film 2, hydrogen ions were implanted at 57 key and in a dose of $6.0 \times 10^{16}$ atoms/cm$^2$.

(Step 2) An R-face sapphire substrate 4 with an outer diameter 150 mm and a thickness 0.6 mm was furnished as the support substrate. The sapphire substrate 4 was placed in a pancake furnace, where an atmosphere of hydrogen alone was established, and heat treated by holding at 1,000° C. for 10 minutes. The metal concentration at the surface of heat treated sapphire substrate 4 was measured with respect to Fe and Ni, which are typical detectable metal elements, by the TRXF (total reflection X-ray fluorescence) method (the lower limit of detection being $0.6 \times 10^{10}$ atoms/cm$^2$). As a result, both the concentrations of relevant elements Fe and Ni were below the detection limit (DL)=$0.6 \times 10^{10}$ atoms/cm$^2$.

Also, the surface roughness of sapphire substrate 4 was measured by an atomic force microscope (AFM), finding that a surface roughness Rms (root mean square) in an area of 5 μm×5 μm was 0.13 nm.

(Step 3) The silicon substrate 1 and the heat treated sapphire substrate 4 were subjected to ion beam activation treatment on their bonding surfaces.

(Step 4) Next, the ion-implanted side surface of the silicon substrate 1 was bonded to the sapphire substrate 4 while heating at 150° C. The thus joined assembly is a bonded substrate 5. The bonded substrate 5 was then heat treated at 225° C. for 24 hours.

(Step 5) While the bonded substrate 5 was heated at 200° C., green laser light of wavelength 532 nm was irradiated from the sapphire substrate 4 side. After the laser light was irradiated over the entire surface of the bonded substrate 5, a mechanical impact was applied to the ion-implanted region 3 in proximity to the bonded interface for separation, yielding a wafer 7 having a silicon thin film 6 transferred to the sapphire substrate 4.

(Step 6) Finally, the silicon thin film 6 on wafer 7 was thinned to 200 nm by CMP, yielding a hybrid substrate 8 which was a SOS substrate. The hybrid substrate 8 was immersed in 50 wt % hydrogen fluoride for 10 minutes and rinsed with pure water. Using a defect inspection machine (KURABO Industries Ltd.), defects on the surface of silicon thin film 6 were counted. The number of defects was 323 per wafer.

Comparative Example 1

For comparison sake, a hybrid substrate 8 was produced by the same procedure as in Example 1 except that a sapphire substrate 4 of the same specification as in Example 1 was used without heat treatment (without Step 2), but after cleaning with solutions SC-1 ($NH_4OH+H_2O_2+H_2O$) and SC-2 ($HCl+H_2O_2+H_2O$).

The sapphire substrate 4 at the end of cleaning was evaluated for surface metal concentration and surface roughness. The metal concentration was $1.3\times10^{11}$ atoms/$cm^2$ for Fe and $6.0\times10^{10}$ atoms/$cm^2$ for Ni. In Example 1, both the concentrations of Fe and Ni were below the lower limit of detection ($0.6\times10^{10}$ atoms/$cm^2$). It was demonstrated that metal impurities were substantially removed from sapphire substrate 4 in Example 1 by the heat treatment (i.e., heat treatment in hydrogen atmosphere at 1,000° C. for 10 min.) of sapphire substrate 4. In Comparative Example 1, the surface roughness Rms was 0.12 nm, and a comparison with Example 1 showed that no difference of significance appeared whether or not sapphire substrate 4 was heat treated. It is proven that the heat treatment does not affect the bonding of silicon substrate 1 and sapphire substrate 4.

The number of defects on the surface of silicon thin film 6 in the resulting hybrid substrate was 525 per wafer. Since the number of defects was 323 per wafer in Example 1, it was demonstrated that the number of defects on the surface of silicon thin film 6 was significantly reduced by the heat treatment (i.e., heat treatment in hydrogen atmosphere at 1,000° C. for 10 min.) of sapphire substrate 4.

Example 2

A hybrid substrate 8 was produced by the same procedure as in Example 1 except that in Step 2, the sapphire substrate 4 was heat treated in an atmosphere of 50 vol % hydrogen+ 50 vol % Ar at 1,000° C. for 20 minutes.

The sapphire substrate 4 at the end of cleaning was evaluated for surface metal concentration and surface roughness. As to the metal concentration, both the concentrations of Fe and Ni were below the lower limit of detection ($0.6\times10^{10}$ atoms/$cm^2$) like Example 1. The surface roughness Rms in Example 2 was 0.12 nm, which was substantially equal to Comparative Example 1 without heat treatment.

The number of defects on the surface of silicon thin film 6 in the resulting hybrid substrate 8 was 82 per wafer. The number of defects was dramatically reduced from Example 1, indicating that the effect of reducing the number of defects depends on the treatment time.

Example 3

A hybrid substrate 8 was produced by the same procedure as in Example 1 except that in Step 2, the sapphire substrate 4 was heat treated in an atmosphere of hydrogen alone at 1,000° C. for 60 minutes.

The sapphire substrate 4 at the end of cleaning was evaluated for surface metal concentration and surface roughness. As to the metal concentration, both the concentrations of Fe and Ni were below the lower limit of detection ($0.6\times10^{10}$ atoms/$cm^2$) like Example 1. The surface roughness Rms in Example 3 was 0.12 nm, which was substantially equal to Comparative Example 1 without heat treatment.

The number of defects on the surface of silicon thin film 6 in the resulting hybrid substrate 8 was 54 per wafer. The number of defects was further reduced from Example 2, indicating that the effect of reducing the number of defects depends on the treatment time.

Example 4

A hybrid substrate 8 was produced by the same procedure as in Example 1 except that in Step 2, the sapphire substrate 4 was heat treated in an atmosphere of hydrogen alone at 700° C. for 10 minutes.

The sapphire substrate 4 at the end of cleaning was evaluated for surface metal concentration and surface roughness. As to the metal concentration, the concentration of Fe was $0.3\times10^{11}$ atoms/$cm^2$ and the concentration of Ni was $1.0\times10^{10}$ atoms/$cm^2$. Although metal impurities were not completely removed, their concentrations were lower than in Comparative Example 1, demonstrating the significant removal of metal impurities. The surface roughness Rms in Example 4 was 0.12 nm, which was substantially equal to Comparative Example 1 without heat treatment.

The number of defects on the surface of silicon thin film 6 in the resulting hybrid substrate 8 was 487 per wafer. The number of defects was somewhat reduced from Comparative Example 1. That is, the heat treatment was observed effective for reducing the metal concentration, but not significantly for reducing the number of defects.

Example 5

A hybrid substrate 8 was produced by the same procedure as in Example 1 except that in Step 2, the sapphire substrate 4 was heat treated in an atmosphere of hydrogen alone at 900° C. for 60 minutes.

The sapphire substrate 4 at the end of cleaning was evaluated for surface metal concentration and surface roughness. As to the metal concentration, both the concentrations of Fe and Ni were below the lower limit of detection ($0.6\times10^{10}$ atoms/$cm^2$) like Example 1. The surface roughness Rms in Example 5 was 0.13 nm, which was substantially equal to Comparative Example 1 without heat treatment.

The number of defects on the surface of silicon thin film 6 in the resulting hybrid substrate 8 was 279 per wafer. The number of defects was reduced to nearly half of the number in Comparative Example 1.

Example 6

A hybrid substrate 8 was produced by the same procedure as in Example 1 except that in Step 2, the sapphire substrate 4 was heat treated in an atmosphere of hydrogen alone at 1,100° C. for 10 minutes.

The sapphire substrate 4 at the end of cleaning was evaluated for surface metal concentration and surface roughness. As to the metal concentration, both the concentrations of Fe and Ni were below the lower limit of detection ($0.6 \times 10^{10}$ atoms/cm$^2$) like Example 1. The surface roughness Rms in Example 5 was 0.11 nm, which was substantially equal to Comparative Example 1 without heat treatment.

The number of defects on the surface of silicon thin film 6 in the resulting hybrid substrate 8 was 305 per wafer, which was substantially equal to Example 1.

Example 7

A hybrid substrate 8 was produced by the same procedure as in Example 1 except that in Step 2, the sapphire substrate 4 was heat treated in an atmosphere of hydrogen alone at 1,250° C. for 10 minutes.

The sapphire substrate 4 at the end of cleaning was evaluated for surface metal concentration and surface roughness.

As to the metal concentration, both the concentrations of Fe and Ni were below the lower limit of detection ($0.6 \times 10^{10}$ atoms/cm$^2$) like Example 1. The surface roughness Rms in Example 7 was 0.11 nm, which was substantially equal to Comparative Example 1 without heat treatment.

The number of defects on the surface of silicon thin film 6 in the resulting hybrid substrate 8 was 3,400 per wafer, which was noticeably increased over Comparative Example 1. It is seen that when the heat treatment temperature in Step 2 exceeds a certain temperature, the effect of heat treatment on metal impurity removal remains unchanged with further temperature elevation, but an upper limit is imposed on the heat treatment temperature as long as the effect of reducing the number of defects on the surface of silicon thin film 6 is concerned.

The results are tabulated in Table 1.

TABLE 1

|  | Hydrogen heat treatment conditions | | Metal concentration on sapphire surface ($\times 10^{10}$ atoms/cm$^2$) | | Sapphire surface roughness Rms (nm) | Number of defects on silicon film surface (defects/wafer) |
| --- | --- | --- | --- | --- | --- | --- |
|  | Temp. (° C.) | Time (min) | Fe | Ni |  |  |
| Example 1 | 1000 | 10 | DL | DL | 0.13 | 323 |
| Example 2 | 1000 | 20 | DL | DL | 0.12 | 82 |
| Example 3 | 1000 | 60 | DL | DL | 0.12 | 54 |
| Example 4 | 700 | 10 | 3 | 1 | 0.12 | 487 |
| Example 5 | 900 | 60 | DL | DL | 0.13 | 279 |
| Example 6 | 1100 | 10 | DL | DL | 0.11 | 305 |
| Example 7 | 1250 | 10 | DL | DL | 0.11 | 3400 |
| Comparative Example 1 | — | — | 13 | 6 | 0.12 | 525 |

Comparative Example 2

To confirm how the effect of reducing the number of defects on silicon thin film 6 varied depending on whether the heat treatment in hydrogen atmosphere was conducted on the sapphire substrate 4 alone prior to bonding or on the hybrid substrate after bonding, the hybrid substrate produced in Comparative Example 1 was heat treated in an atmosphere of hydrogen alone at 1,000° C. for 10 minutes. The number of defects on the surface of silicon thin film in the thus heat treated hybrid substrate was counted by the same method as in Example 1, and the count was more than 10,000 defects per wafer. That is, the heat treatment following the bonding step is not at all effective for reducing the number of defects. To gain both the effect of metal impurity removal and the effect of reducing the number of defects on the surface of silicon thin film in hybrid substrate, the sapphire substrate 4 must be previously heat treated in a hydrogen-containing atmosphere prior to bonding.

Although the invention has been described with reference to the embodiment illustrated in the drawing, the invention is not limited thereto, and other embodiments may occur to, or various additions, changes and deletions may be made by those skilled in the art. All such embodiments fall in the scope of the invention as long as the advantages and results of the invention are obtainable.

REFERENCE SIGNS LIST

1 silicon substrate
2 insulating film (silicon oxide film)
3 ion-implanted region
4 sapphire substrate
5 bonded substrate (joined assembly)
6 silicon thin film
7 wafer
8 hybrid substrate (SOS substrate)

The invention claimed is:

1. A hybrid substrate comprising a semiconductor layer on a support substrate via an insulating film, the hybrid substrate being obtained by the method comprising the steps of:
   implanting ions into a surface of a semiconductor substrate to form an ion-implanted region;
   bonding the ion-implanted surface of the semiconductor substrate to a surface of a support substrate via an insulating film; and
   separating the semiconductor substrate at the ion-implanted region, thus leaving a hybrid substrate having a semiconductor layer on the support substrate,
   wherein the support substrate is heat treated at a temperature of 700 to 1,100° C. in a reducing atmosphere for reducing the concentration of metal impurities at the surface of the support substrate and reducing a number of defects on the semiconductor layer of the hybrid substrate prior to the step of bonding the support substrate to the semiconductor substrate,
   wherein at the surface of the support substrate, the concentration of Fe is up to $3 \times 10^{10}$ atoms/cm$^2$ and the concentration of Ni is up to $1 \times 10^{10}$ atoms/cm$^2$, and a number of defects on the surface of the semiconductor layer, which is counted after immersing the hybrid substrate having an outer diameter of 150 mm in 50 wt % hydrogen fluoride solution, is 487 or less.

2. The hybrid substrate of claim 1, wherein the support substrate is heat treated at a temperature of at least 900° C.

3. The hybrid substrate of claim 1, wherein the reducing atmosphere is hydrogen or an inert gas atmosphere containing hydrogen.

4. The hybrid substrate of claim 1, wherein the semiconductor substrate comprises a material selected from the group consisting of silicon, silicon-germanium, silicon carbide, germanium, gallium nitride, zinc oxide, and gallium arsenide.

5. The hybrid substrate claim 1, wherein the support substrate comprises a material selected from the group consisting of silicon, silicon carbide, silicon nitride, sapphire, diamond, aluminum nitride, gallium nitride, zinc oxide, quartz, and borosilicate glass.

6. The hybrid substrate of claim 1, wherein the semiconductor substrate is heat treated for at least 10 seconds and up to 12 hours.

7. The hybrid substrate of claim 1, wherein the insulating film is a silicon oxide film, an aluminum oxide film or a silicon nitride film.

8. The hybrid substrate of claim 1, wherein the support substrate is a sapphire substrate.

* * * * *